(12) United States Patent
Glenn et al.

(10) Patent No.: US 6,455,927 B1
(45) Date of Patent: Sep. 24, 2002

(54) MICROMIRROR DEVICE PACKAGE

(75) Inventors: Thomas P. Glenn, Gilbert; Steven Webster; Roy Dale Hollaway, both of Chandler, all of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/804,749

(22) Filed: Mar. 12, 2001

(51) Int. Cl.⁷ .............................................. H01L 23/02
(52) U.S. Cl. ...................................... 257/686; 257/680
(58) Field of Search ................................. 257/686, 704, 257/680; 438/53, 109, 125, 116

(56) References Cited

U.S. PATENT DOCUMENTS

| | | | |
|---|---|---|---|
| 5,192,946 A | 3/1993 | Thompson et al. | 340/794 |
| 5,658,063 A | 8/1997 | Nasserbakht | 353/122 |
| 6,140,144 A * | 10/2000 | Najafi et al. | 438/53 |
| 6,266,197 B1 * | 7/2001 | Glenn et al. | 359/819 |
| 6,323,550 B1 * | 11/2001 | Martin et al. | 257/704 |

\* cited by examiner

*Primary Examiner*—Hoai Ho
*Assistant Examiner*—Long K. Tran
(74) *Attorney, Agent, or Firm*—Gunnison, McKay & Hodgson, L.L.P.; Serge J. Hodgson

(57) ABSTRACT

A micromirror device package includes a micromirror device chip having a micromirror device area on an upper surface of the micromirror device chip. A window is mounted above the micromirror device area and to the upper surface of the micromirror device chip by a bead. By forming the window of borosilicate glass and the bead of solder glass, the micromirror device area is hermetically sealed. In this manner, corrosion and contamination of the micromirror device area is prevented.

29 Claims, 7 Drawing Sheets

MICROMIRROR DEVICE PACKAGE

BACKGROUND OF THE INVENTION

1. Field of the Invention

The present invention relates generally to electronic component packaging. More particularly, the present invention relates to a microelectromechanical device package.

2. Description of Related Art

Microportable projectors were capable of projecting digital images with remarkable clarity and color. The cornerstone of these microportable projectors was the micromirror device chip.

As is well known, a micromirror device chip included a micromirror device area, which selectively reflected visible light to project the digital images. More particularly, the micromirror device area contained an array of miniature moveable micromirrors, sometimes called microscopic mirrors. These microscopic mirrors were selectively switched on and off, which in turn selectively reflected the visible light to form the digital images.

However, these microscopic mirrors were extremely sensitive to moisture and contamination. For this reason, the micromirror device chip was hermetically sealed in a seam welded housing. This housing supported a window above the micromirror device area. However, providing and seam welding such a housing was extremely expensive and thus significantly added to the fabrication cost of the microportable projector.

Further, it was important that the microportable projector be as small and light as possible. However, the housing, which hermetically sealed the micromirror device chip, was relatively bulky and heavy.

SUMMARY OF THE INVENTION

In accordance with the present invention, a window is mounted directly to an upper surface of a micromirror device chip. More particularly, the window is mounted above a micromirror device area on the upper surface of the micromirror device chip by a bead. The window in combination with the bead forms a hermetic enclosure about the micromirror device area thus protecting the micromirror device area from moisture and contamination.

Advantageously, the resulting micromirror device package is fabricated at a relatively low cost, is relatively thin and lightweight, and can readily be used to fabricate a variety of micromirror device assemblies.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
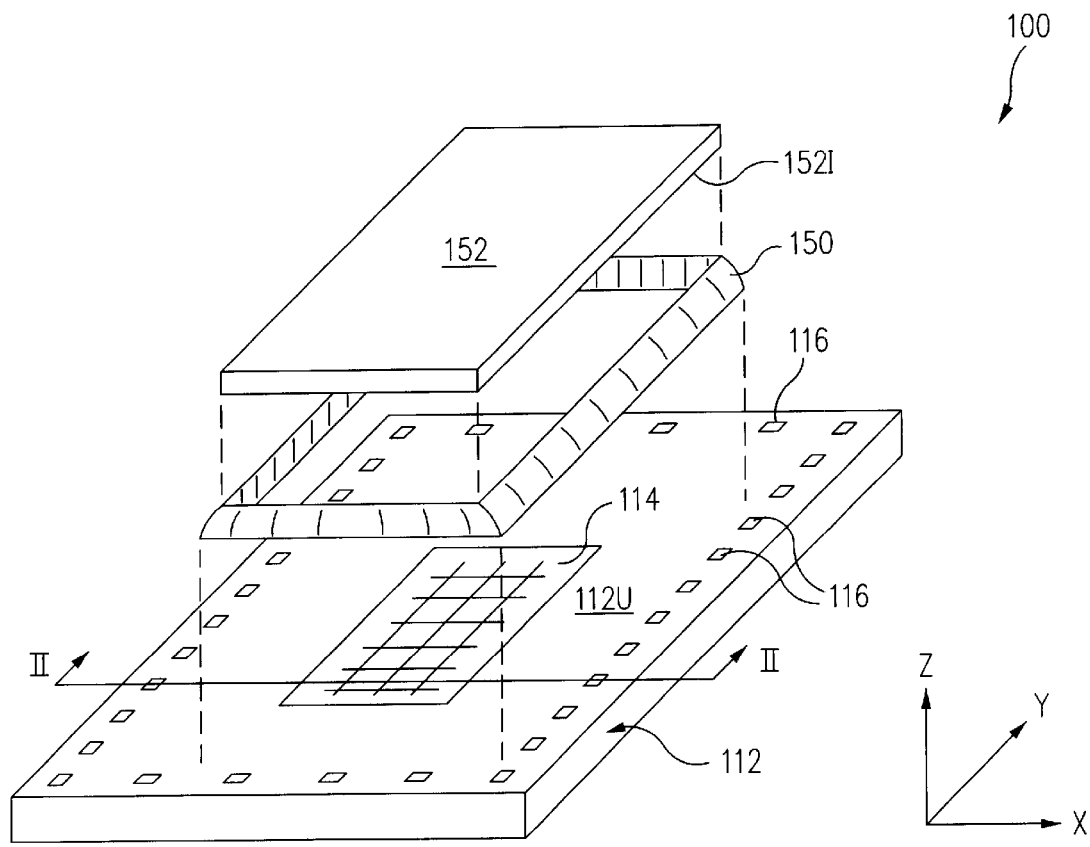
FIG. 1 is an exploded perspective view of a micromirror device package in accordance with the present invention.

In accordance with the present invention, a window 152 (FIGS. 1, 2) is mounted directly to an upper surface 112U of a micromirror device chip 112. More particularly, window 152 is mounted above a micromirror device area 114 on upper surface 112U of micromirror device chip 112 by a bead 150. Window 152 in combination with bead 150 forms a hermetic enclosure about micromirror device area 114 thus protecting micromirror device area 114 from moisture and contamination.

Advantageously, the resulting micromirror device package 100 is fabricated at a relatively low cost, is relatively thin and lightweight, and can readily be used to fabricate a variety of micromirror device assemblies.

Figure 2:
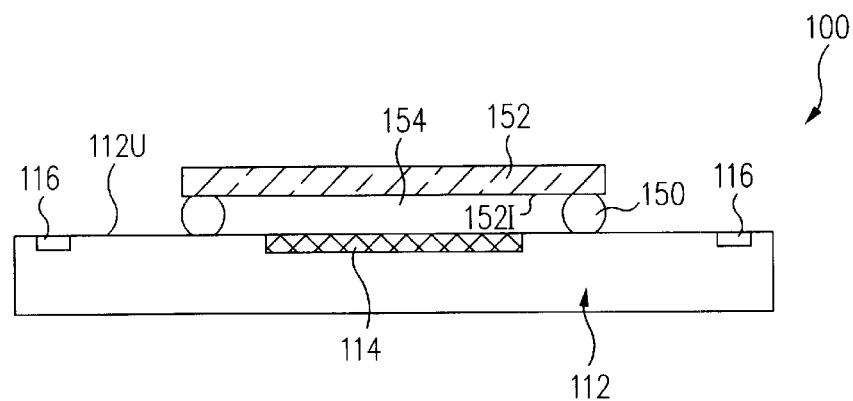
FIG. 2 is a cross-sectional view of the micromirror device package along the line II—II of FIG. 1.

More particularly, FIG. 1 is an exploded perspective view of a micromirror device package 100 in accordance with the present invention. FIG. 2 is a cross-sectional view of micromirror device package 100 along the line II—II of FIG. 1. Referring to FIGS. 1 and 2 together, micromirror device package 100 includes a micromirror device chip 112. Micromirror device chip 112 includes a micromirror device area 114 on an upper, e.g., first, surface 112U of micromirror device chip 112. Micromirror device area 114 includes miniature moveable micromirrors, sometimes called microscopic mirrors, which are well known to those of skill in the art. The miniature moveable micromirrors switch on and off to selectively reflect radiation.

Also formed on upper surface 112U of micromirror device chip 112 are a plurality of bond pads 116. Bond pads 116 are connected to the internal circuitry of micromirror device chip 112.

Attached, i.e., secured, to upper surface 112U of micromirror device chip 112 is a bead 150. Bead 150 defines an area of upper surface 112U, which includes micromirror device area 114. More particularly, bead 150 surrounds micromirror device area 114 around a perimeter of micromirror device area 114 yet does not extend into micromirror device area 114. Further, bead 150 does not encompass and leaves exposed bond pads 116. Generally, bead 150 is located between micromirror device area 114 and bond pads 116.

In one embodiment, bead 150 is solder glass, sometimes called lead glass frit material. For example, bead 150 is a lead-based compound such as IWAKI IWAKT-T-187, Kyocera KC-IM, Kyocera KC-402 or another similar material such as that available from Corning, Inc. In another embodiment, bead 150 is an epoxy, although other materials are used in other embodiments.

Bead 150 attaches, i.e., secures, a window 152 to upper surface 112U. In particular, bead 150 is attached to the perimeter of an inner, e.g., first, surface 152I of window 152. Window 152 is substantially parallel to upper surface 112U and is spaced apart from upper surface 112U by bead 150. Window 152 is located directly above micromirror device area 114 and has a greater width along the x-axis and a greater length along the y-axis than micromirror device area 114. Generally, bead 150 is a bonding material, which bonds window 152 to micromirror device chip 112.

Generally, window 152 is transparent to the radiation of interest, for example, window 152 is optically clear glass. Typically, the radiation of interest is visible light. This visible light is directed at micromirror device area 114. This visible light passes through window 152 and strikes micromirror device area 114. Micromirror device area 114 selectively reflects this visible light back through window 152 as a digital image. In this embodiment, window 152 is borosilicate glass although other transparent materials are used in other embodiments.

Bead 150 and window 152 form an enclosure, which defines a cavity 154, i.e., a free space, above micromirror device area 114. Cavity 154 allows the miniature moveable micromirrors of micromirror device area 114 to freely move. To insure cavity 154 is adequate to allow free movement of the miniature moveable micromirrors of micromirror device area 114, it is important that window 152 is flat. For example, the maximum allowable deviation from a hypothetical mean plane generally parallel to inner surface 152I of window 152 is 0.004 inches over 2.0 inches of inner surface 152I scaled to the actual size of inner surface 152I. Although window 152 is described as flat, in light of this disclosure, is understood that generally window 152 has any shape which prevents window 152 from extending downwards towards micromirror device area 114.

To seal micromirror device area 114, it is important that both bead 150 and window 152 are substantially impervious to moisture. More particularly, by forming window 152 of borosilicate glass and bead 150 of solder glass, micromirror device area 114 is hermetically sealed. In this manner, corrosion of the moisture sensitive miniature moveable micromirrors of micromirror device area 114 is prevented.

Advantageously, by hermetically sealing micromirror device area 114 with window 152 and bead 150, the seam welded housing of the prior art is unnecessary and eliminated. Accordingly, micromirror device package 100 is fabricated at a relatively low cost compared to the prior art. Further, micromirror device package 100 is relatively thin and lightweight compared to the prior art.

To further reduce the costs associated with each micromirror device package 100, in one embodiment, a plurality of windows 152 are attached to a plurality of micromirror device chips 112 while micromirror device chips 112 are integrally connected together, e.g., while still in wafer form.

Figure 3:
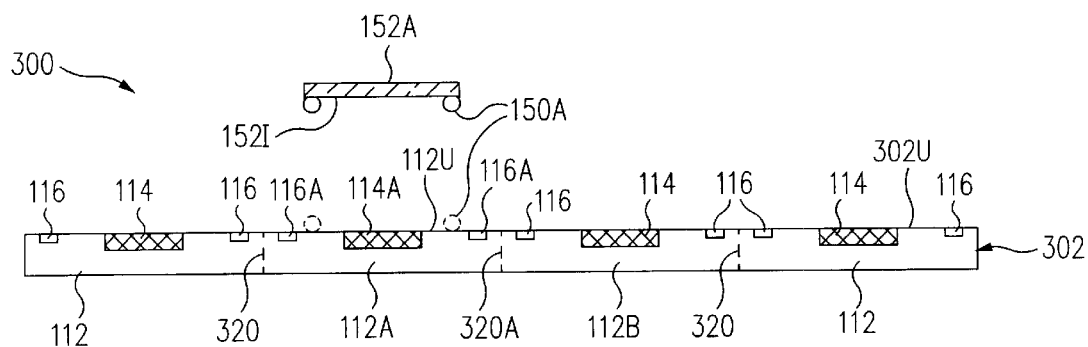
FIG. 3 is a cross-sectional view of a structure during the formation of a plurality of micromirror device packages in accordance with the present invention.

FIG. 3 is a cross-sectional view of a structure 300 during the formation of a plurality of micromirror device packages 100 in accordance with the present invention. As shown in FIG. 3, a micromirror device substrate 302, e.g., a silicon or gallium arsenide wafer, includes a plurality of micromirror device chips 112 integrally connected to one another. Micromirror device chips 112 include micromirror device areas 114 formed on an upper, e.g., first, surface 302U of micromirror device substrate 302. Micromirror device areas 114 include the miniature moveable micromirrors. Micromirror device chips 112 further include bond pads 116 on upper surface 302U of micromirror device substrate 302. Bond pads 116 are connected to the internal circuitry of micromirror device chips 112.

To illustrate, a first micromirror device chip 112A of the plurality of micromirror device chips 112 includes a first micromirror device area 114A of the plurality of micromirror device areas 114. Micromirror device chip 112A also includes a first bond pad 116A of the plurality of bond pads 116. The other micromirror device chips 112 include micromirror device areas 114 and bond pads 116 in a similar manner.

Micromirror device chips 112 are integrally connected together in an array, e.g., a 2×2, 3×3, . . . or n×m array.

Each of micromirror device chips 112 is delineated by a singulation street 320, which is located between adjacent micromirror device chips 112. For example, a first singulation street 320A of the plurality of singulation streets 320 of micromirror device substrate 302 delineates first micromirror device chip 112A from a second micromirror device chip 112B of the plurality of micromirror device chips 112. The other micromirror device chips 112 are similarly delineated from adjacent micromirror device chips 112 by corresponding singulation streets 320.

Of importance, micromirror device chips 112 are tested for validity, i.e., to determine whether each micromirror device chip 112 is good or defective, before windows 152 are attached to micromirror device substrate 302 and while micromirror device chips 112 are integrally attached to one another. Any defective micromirror device chips 112 are marked or otherwise identified.

As shown in FIG. 3, a bead 150A is attached to a perimeter of an inner surface 152I of a window 152A. In one embodiment, window 152A is borosilicate glass.

In one embodiment, bead 150A is solder glass. In accordance with this embodiment, bead 150A is attached to inner surface 152I using any one of a number of methods well known to those of skill in the art such as by screening or needle dispensing.

Generally, screening includes applying lead glass paste and drying this paste. For example, a two inch by two inch square single piece of borosilicate glass includes a plurality of windows 152 integrally connected together. The material of beads 150 is screened onto a surface of the single piece of borosilicate glass. The single piece of borosilicate glass is singulated, e.g., by sawing, and then cleaned to form a plurality of windows 152 having beads 150 attached, including window 152A having bead 150A attached. As another example, bead 150A is screened directly to an individual window 152A.

After bead 150A is applied to window 152A, window 152A is positioned above first micromirror device chip 112A. Micromirror device substrate 302 and window 152A are heated. In one embodiment, micromirror device substrate 302 is heated to within the approximate range of 100° C. to 300° C. and window 152A is heated to within the approximate range of 100° C. to 320° C. although other temperatures are used in other embodiments. In one particular embodiment, micromirror device substrate 302 is heated to 300° C. and window 152A is heated to 320° C. Heating of window 152A causes bead 150A to melt.

A hot cap sealer, which is well known to those of skill in the art, places window 152A over micromirror device area 114A such that melted bead 150A contacts upper surface 302U of micromirror device substrate 302 around a perimeter of micromirror device area 114A. Bead 150A cools, solidifies and attaches to upper surface 112U of micromirror device chip 112A thus securing window 152A to micromirror device chip 112A.

Alternatively, bead 150A (shown in dashed lines) is applied directly on upper surface 302U of micromirror device substrate 302 around a perimeter of micromirror device area 114A, e.g., by screening. After bead 150A is applied, micromirror device substrate 302 is heated to melt bead 150A. A pick and place machine places window 152A over micromirror device area 114A such that inner surface 152I of window 152A contacts bead 150A. Bead 150A cools, solidifies and attaches to interior surface 152I of window 152A thus securing window 152A to micromirror device chip 112A.

The other windows 152 are attached to the other good micromirror device chips 112 in a manner similar to the attachment of window 152A to micromirror device chip 112A one at a time or simultaneously. Micromirror device substrate 302 is continuously heated while the other windows 152 are attached to the other good micromirror device chips 112.

Figure 4:
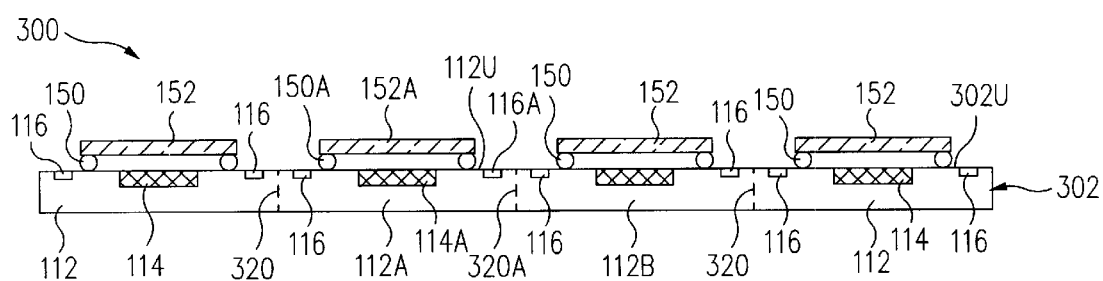
FIG. 4 is a cross-sectional view of the structure of FIG. 3 at a later stage of fabrication in accordance with the present invention.

FIG. 4 is a cross-sectional view of structure 300 at a later stage of fabrication in accordance with the present invention. As shown in FIG. 4, windows 152 are attached to micromirror device chips 112 which have passed validity testing, i.e., which are good. Advantageously, windows 152 are attached only to micromirror device chips 112 which have been tested and found to be good. Windows 152 are not attached to defective micromirror device chips 112 (not shown). In this manner, waste of windows 152 is avoided and labor associated with attaching windows 152 to defective micromirror device chips 112 is saved. This, in turn, minimizes the cost associated with the fabrication of each batch of micromirror device packages 100 and, more particularly, with each micromirror device package 100.

Referring again to FIG. 4, after windows 152 are attached to micromirror device substrate 302, structure 300 is heated to anneal and release any built-up stress in structure 300 including windows 152, beads 150 and micromirror device substrate 302. In one embodiment, structure 300 is heated to within the approximate range of 425° C. to 435° C. for approximately 2 to 4 minutes.

Micromirror device substrate 302 is then singulated along singulation streets 320 resulting in a plurality of micromirror device packages 100 (see FIGS. 1, 2). Although the fabrication of a plurality of micromirror device packages 100 simultaneously is described above, in light of this disclosure, those of skill in the art will understand that similar techniques are used to fabricate each micromirror device package 100 on an individual basis, if desired.

Referring again to FIGS. 1 and 2 together, micromirror device package 100 is then attached to a larger substrate such as a printed circuit mother board using methods well known to those skilled in the art. Alternatively, micromirror device package 100 is further packaged as discussed in greater detail below with respect to FIGS. 9, 10, and 11. Of importance, window 152 in combination with bead 150 seals and protects micromirror device area 114 from the ambient environment as well as from any plastic encapsulant used to further package micromirror device package 100.

Figure 5:
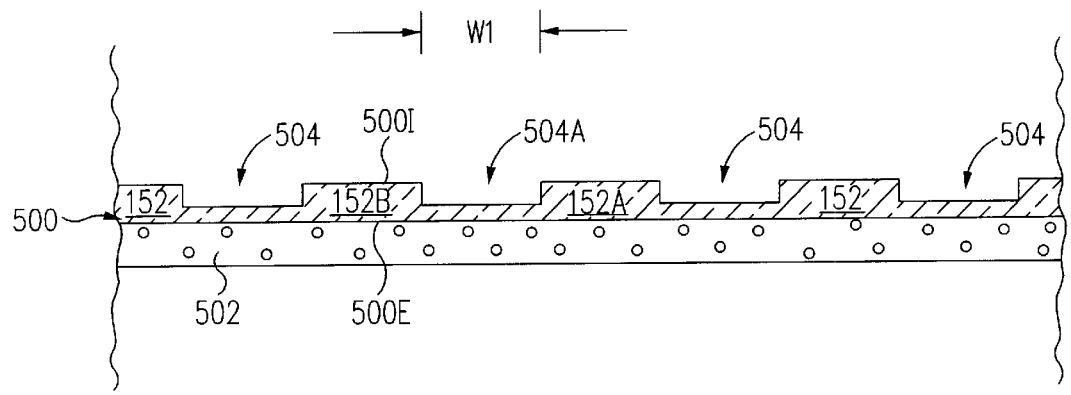
FIG. 5 is a cross-sectional view of a single window sheet during the formation of a plurality of windows.

In an alternative embodiment, windows 152 are mounted to micromirror device substrate 302 simultaneously as part of a single window sheet. FIG. 5 is a cross-sectional view of a single window sheet 500 during the formation of a plurality of windows 152 including a first window 152A and a second window 152B. Illustratively, window sheet 500 is a sheet of borosilicate glass.

Initially, window sheet 500 is attached to a support 502 such as a sticky tape used in wafer dicing as is well known to those of skill in the art. A series of shallow cuts 504 are made in an interior, e.g., first, surface 500I of window sheet 500, for example, with a saw blade, to define and delineate windows 152. For example, a first shallow cut 504A of the plurality of shallow cuts 504 defines and delineates first window 152A from second window 152B. An exterior, e.g., second, surface 500E of window sheet 500 is attached to support 502. of importance, shallow cut 504A only score window sheet 500 and does not cut through window sheet 500. Generally, shallow cut 504A has a width W1. The other shallow cuts 504 are similar to shallow cut 504A. Further, the other windows 152 are similarly defined and delineated from adjacent windows 152 by corresponding shallow cuts 504. Generally, windows 152 are formed in an array, e.g., a 2×2, 3×3, . . . or n×m array.

Figure 6A:
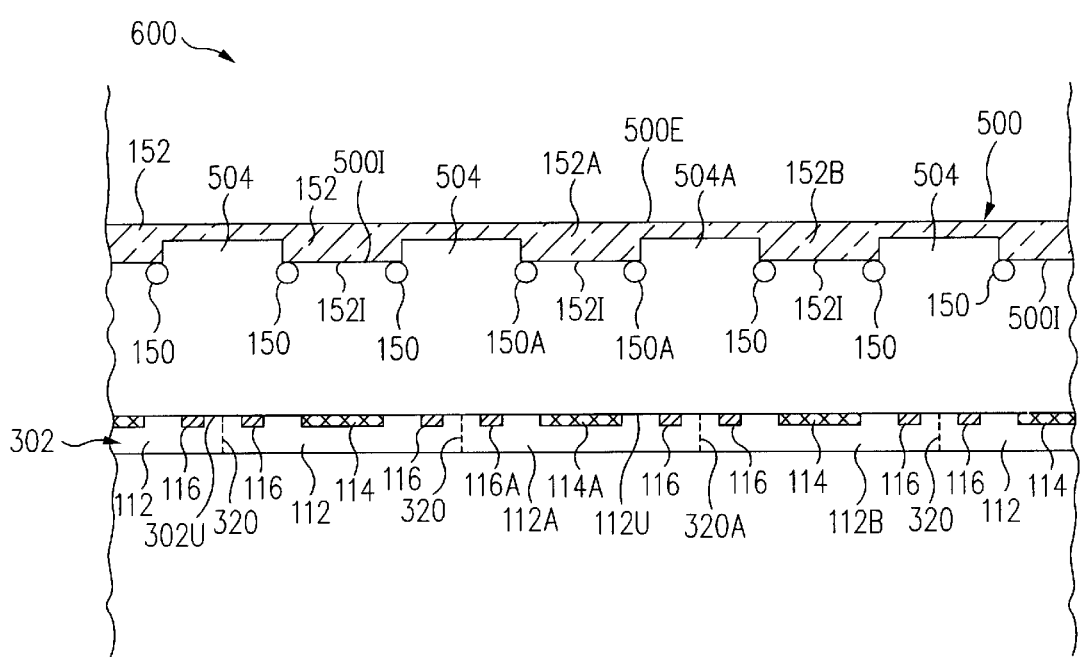
FIGS. 6A and 6B are cross-sectional views of a structure during the fabrication of a plurality of micromirror device packages in accordance with various embodiments of the present invention.

FIG. 6A is a cross-sectional view of a structure 600 during the fabrication of a plurality of packages 100 (FIGS. 1, 2) in accordance with one embodiment of the present invention. Structure 600 includes micromirror device substrate 302 described above in detail in reference to FIG. 3.

As shown in FIG. 6A, a bead 150A is applied, e.g., by screening, to a perimeter of an inner surface 152I of window 152A. The other beads 150 are applied to the other windows 152 in a similar manner. After beads 150 are applied to window sheet 500, window sheet 500 is positioned above micromirror device substrate 302. Micromirror device substrate 302 and window sheet 500 are heated. In one embodiment, micromirror device substrate 302 is heated to within the approximate range of 100° C. to 300° C. and window sheet 500 is heated to within the approximate range of 100° C. to 320° C. although other temperatures are used in other embodiments. In one particular embodiment, micromirror device substrate 302 is heated to 300° C. and window sheet 500 is heated to 320° C. Heating of window sheet 500 causes beads 150 to melt.

Window sheet 500 is then placed on micromirror device substrate 302 such that each melted bead 150 contacts upper surface 302U of micromirror device substrate 302 around a perimeter of the corresponding micromirror device area 114. Beads 150 cool, solidified, and attach window sheet 500 to micromirror device substrate 302.

To illustrate, melted bead 150A contacts upper surface 302U of micromirror device substrate 302 around a perimeter of micromirror device area 114A. Bead 150A cools, solidifies and attaches to upper surface 112U of micromirror device chip 112A thus securing window 152A to micromirror device chip 112A.

Figure 6B:
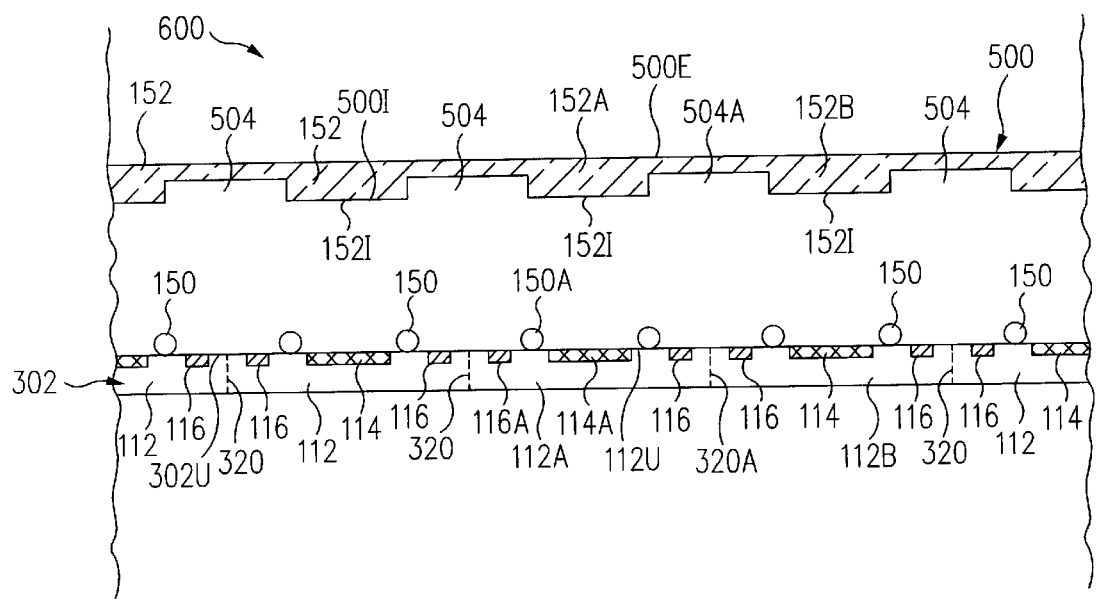

FIG. 6B is a cross-sectional view of structure 600 during the fabrication of a plurality of packages 100 (FIGS. 1, 2) in accordance with an alternative embodiment of the present invention. Referring now to FIG. 6B, in accordance with this embodiment, instead of applying beads 150 to window sheet 500, beads 150 are applied directly on upper surface 302U of micromirror device substrate 302 around perimeters of micromirror device areas 114.

To illustrate, bead 150A is applied directly on upper surface 302U of micromirror device substrate 302 around a perimeter of micromirror device area 114A, e.g., by screening. Window sheet 500 is then placed on micromirror device substrate 302 such that each melted bead 150 contacts interior surfaces 152I of windows 152. Beads 150 cool, solidified, and attach window sheet 500 to micromirror device substrate 302.

To illustrate, melted bead 150A contacts a periphery of interior surface 152I of window 152A. Bead 150A cools, solidifies and attaches to interior surface 152I of window 152A thus securing window 152A to micromirror device chip 112A.

Figure 7:
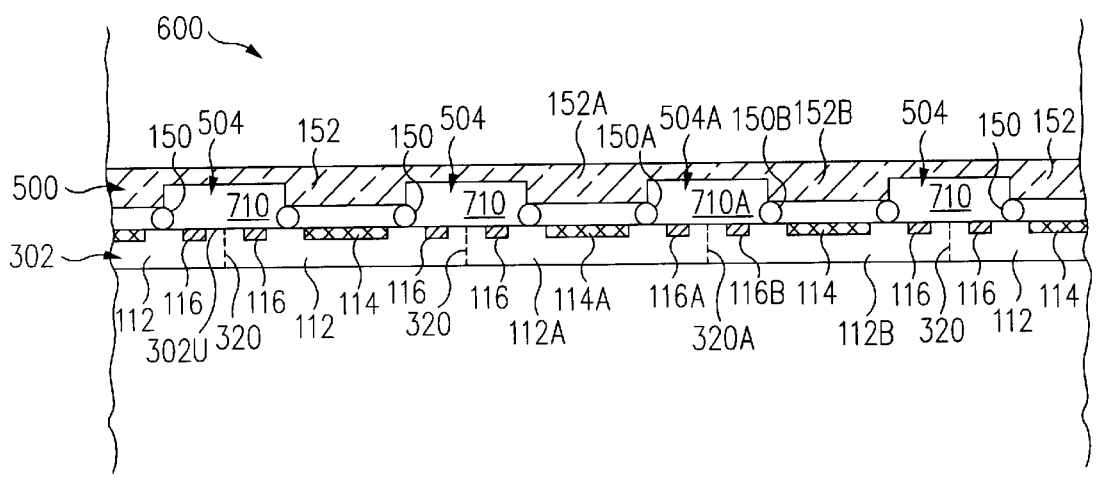
FIG. 7 is a cross-sectional view of the structure of FIG. 6A or FIG. 6B at a further stage of fabrication.

FIG. 7 is a cross-sectional view of structure 600 of FIG. 6A or FIG. 6B at a further stage of fabrication. Referring now to FIG. 7, window sheet 500 is mounted to micromirror device substrate 302 by beads 150. Of importance, window sheet 500 is aligned with micromirror device substrate 302 such that shallow cuts 504 are aligned with corresponding singulation streets 320 and corresponding bond pads 116. Thus, cavities 710 are formed by shallow cuts 504, beads 150, and upper surface 302U of micromirror device substrate 302. Cavities 710 are located above, i.e., in a first direction from, singulation streets 320 and adjacent bond pads 116.

To illustrate, micromirror device chip 112A includes bond pad 116A. Micromirror device chip 112B includes a second bond pad 116B of the plurality of bond pads 116. Bond pads 116A, 116B are formed directly adjacent to singulation street 320A and are opposite one another relative to singulation street 320A.

A first cavity 710A of the plurality of cavities 710 is formed by shallow groove 504A, bead 150A, a second bead 150B of the plurality of beads 150, and upper surface 302U of micromirror device substrate 302. Cavity 710A is above singulation street 320A and bond pads 116A, 116B.

Cavities 710 are located between window sheet 500 and bond pads 116 and singulation streets 320. Of importance, cavities 710 accommodate tolerance in removal, e.g., sawing, of window sheet 500 above bond pads 116 and singulation streets 320 as discussed in greater detail below with reference to FIGS. 8A, 8B. Although cavities 710 are illustrated as being separate from one another in FIG. 7, in light of this disclosure, it is understood that cavities 710 run into one another as part of a larger checkerboard type cavity.

Figure 8A:
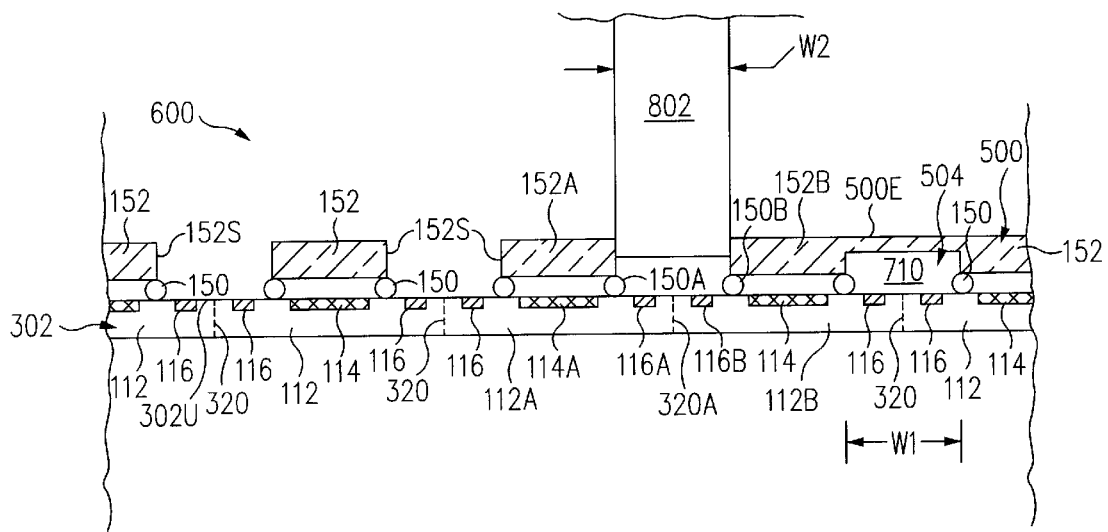
FIGS. 8A and 8B are cross-sectional views of the structure of FIG. 7 at a further stage of fabrication in accordance with various embodiments of the present invention.

FIG. 8A is a cross-sectional view of structure 600 of FIG. 7 at a further stage of fabrication in accordance with one embodiment of the present invention. As shown in FIG. 8A, window sheet 500 is cut from exterior surface 500E to singulate windows 152 from one another. Window sheet 500 is cut by a sawblade 802, although in other embodiments, window sheet 500 is cut using a different technique, e.g., by a laser.

Window sheet 500 is cut from exterior surface 500E directly opposite of cavities 710 and above singulation streets 320 and bond pads 116. Window sheet 500 is cut all the way through to cavities 710 and to shallow cuts 504. The depth to which sawblade 802 cuts below exterior surface 500E is set to be sufficiently deep to insure that sawblade 802 cuts all the way through window sheet 500, yet is set to be sufficiently shallow to insure that sawblade 802 does not damage bond pads 116 and, more generally, micromirror device substrate 302. Advantageously, cavities 710 accommodate tolerance during cutting of window sheet 500.

Width W2 of sawblade 802 is approximately the same as width W1 of shallow cuts 504. In this manner, windows 152 are formed to have planar, i.e., flat, sides 152S.

To illustrate, sawblade 802 is illustrated as cutting through window sheet 500 from exterior surface 500E between window 152A and window 152B. Sawblade 802 cuts all the way through window sheet 500 to cavity 710A (FIG. 7) above bond pad 116A, bond pad 116B and singulation street 320A thus singulating window 152A from window 152B. Sawblade 802 singulates the other windows 152 in a similar manner.

As set forth above, by having width W2 of sawblade 802 to be approximately equal to width W1 of shallow cuts 504, windows 152 are formed to have planar sides 152S. However, in certain instances, it is desirable to form a locking feature along sides 152S.

Figure 8B:
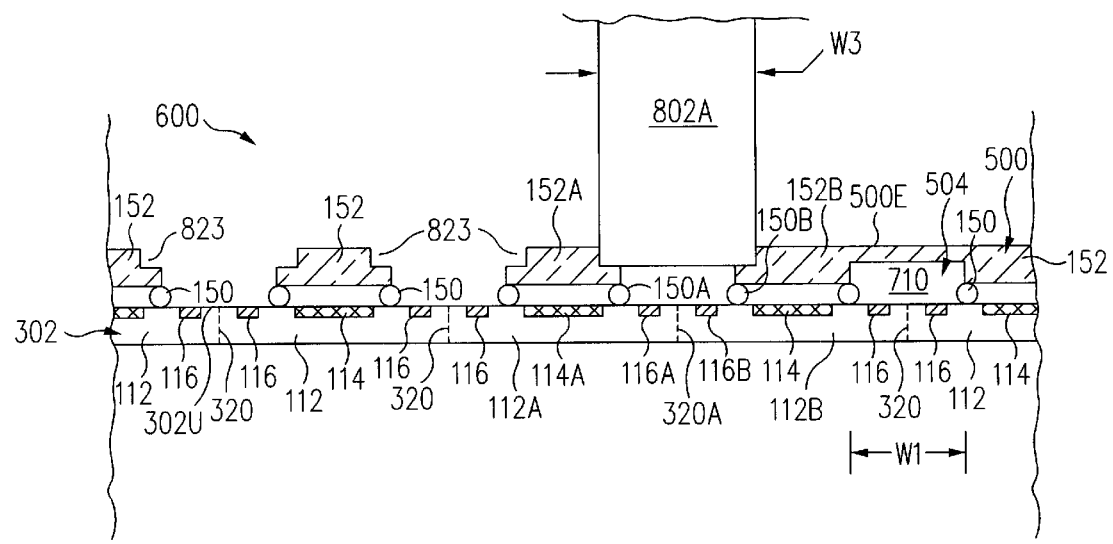

FIG. 8B is a cross-sectional view of structure 600 of FIG. 7 at a further stage of fabrication in accordance with an alternative embodiment of the present invention. FIG. 8B is substantially similar to FIG. 8A and only the significant differences are discussed below.

Referring now to FIG. 8B, window sheet 500 is cut from exterior surface 500E to singulation windows 152 from one another. Window sheet 500 is cut by a sawblade 802A, although in other embodiments, window sheet 500 is cut using a different technique, e.g., by a laser.

Window sheet 500 is cut from exterior surface 500E directly opposite of cavities 710 and above singulation streets 320 and bond pads 116. Window sheet 500 is cut all the way through to cavities 710.

Width W3 of sawblade 802A is greater than width W1 of shallow cuts 504. In this manner, windows 152 are formed to have locking features 823. In this embodiment, locking features 823 are stepped shaped as illustrated in FIG. 8B. However, locking features 823 have other shapes, e.g., tapers, in other embodiments.

To illustrate, sawblade 802A is illustrated as cutting through window sheet 500 from exterior surface 500E between window 152A and window 152B. Sawblade 802A cuts all the way through window sheet 500 to cavity 710A (FIG. 7) above bond pad 116A, bond pad 116B and singulation street 320A thus singulating window 152A from window 152B. Width W3 of sawblade 802A is greater than width W1 of shallow cuts 504 resulting in the formation of windows 152A, 152B having locking features 823. Sawblade 802A singulates the other windows 152 in a similar manner.

Advantageously, shallow cuts 504 and the cuts made by sawblade 802A in window sheet 500 are desirably rough cuts to enhance the locking ability of locking features 823. Since rough cuts are desirable, shallow cuts 504 and the cuts made by sawblade 802A can be made using a high-speed cutting process.

In contrast, for aesthetic, safety and other reasons, prior art windows for micromirror device assemblies were formed with finished cuts, i.e., smooth cuts. In other words, chipped, jagged or damaged windows were unacceptable for use in prior art micromirror device assemblies and were discarded. Further, to form windows with the finished cuts, a slow-speed cutting process was used. For these reasons, windows 152 in accordance with the present invention are fabricated at a lower cost than windows of prior art micromirror device assemblies.

After singulation of windows 152, bond pads 116 and singulation streets 320 are laterally located between adjacent windows 152 and are not covered by windows 152. To illustrate, bond pad 116A, bond pad 116B and singulation street 320A are laterally located between window 152A and window 152B.

Micromirror device substrate 302 is then singulated along singulation streets 320. Singulation is accomplished using any one of a number of conventional singulation techniques, e.g., by laser cutting or mechanical sawing through micromirror device substrate 302.

Of importance, referring again to FIG. 8B, micromirror device areas 114 of micromirror device chips 112 are protected by windows 152 during singulation of micromirror device substrate 302. More particularly, windows 152 protect micromirror device areas 114 from contamination and scratching during singulation, e.g., from silicon shards. As a result, damage or destruction of micromirror device chips 112 is avoided. Accordingly, yield is increased and package cost is reduced compared to the prior art.

Further, windows 152 protect micromirror device area 114 during subsequent processing of micromirror device package 100, e.g., during subsequent wire bonding and/or encapsulation and/or molding. More particularly, windows 152 protect micromirror device areas 114 from dust and contamination. Accordingly, structure 600 and, after singulation of micromirror device substrate 302, packages 100 can be stored or further packaged in any facility with or without a cleanroom.

Further, by forming a plurality of packages 100 simultaneously, several advantages are realized. One advantage is that it is less labor intensive to handle and process a plurality of packages 100 simultaneously rather than to handle and process each package 100 on an individual basis. Another advantage is that usage of materials is more efficient when an array of packages 100 is fabricated. By reducing labor and using less material, the cost associated with each micromirror device package 100 is minimized. However, in light of this disclosure, those of skill in the art will recognize that packages 100 can also be manufactured on an individual basis, if desired. For example, referring to FIGS. 1 and 2, window 152 is attached by bead 150 after micromirror device chip 112 is die attached and/or wire bonded.

In one embodiment, after singulation of micromirror device substrate 302, micromirror device package 100 (FIG. 1) is further packaged. Advantageously, since micromirror device area 114 of micromirror device chip 112 is protected by window 152, micromirror device package 100 can be further packaged using any one of a number of conventional packaging techniques, e.g., standard molding and/or liquid encapsulation techniques. For example, micromirror device package 100 is put into a flip chip micromirror device assembly such as that illustrated in FIG. 9, a leadframe micromirror device assembly such as that illustrated in FIG. 10 or a wirebonded micromirror device assembly such as that illustrated in FIG. 11.

Figure 9:
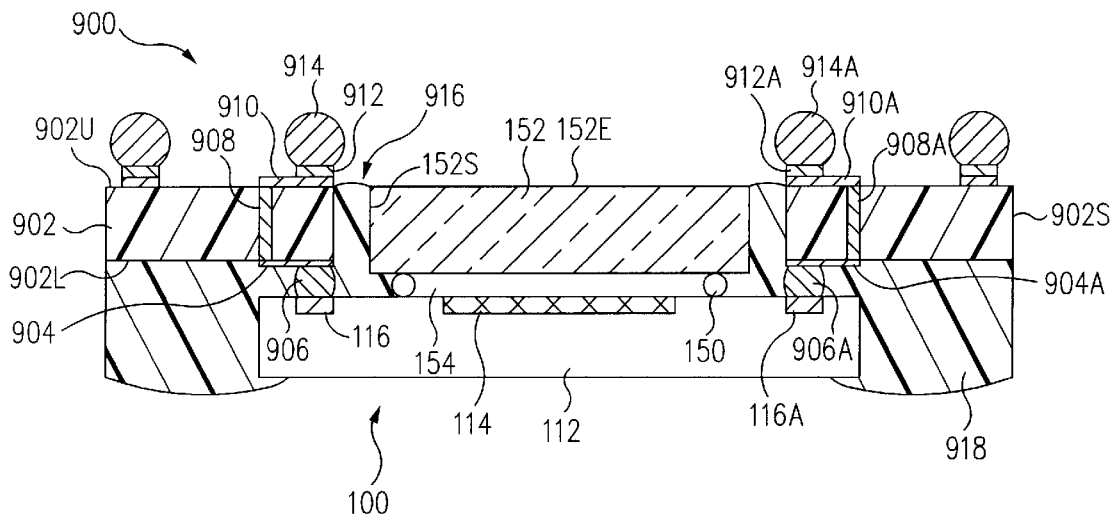
FIG. 9 is a cross-sectional view of a flip chip micromirror device assembly in accordance with one embodiment of the present invention.

FIG. 9 is a cross-sectional view of a flip chip micromirror device assembly 900 (hereinafter assembly 900) in accordance with one embodiment of the present invention. Referring to FIG. 9, assembly 900 includes a substrate 902. To illustrate, substrate 902 is a printed circuit board or, alternatively, is tape, as those of skill in the art will understand.

Substrate 902 includes a plurality of electrically conductive traces 904 formed on a lower, e.g., first, surface 902L of substrate 902. Bond pads 116 are electrically connected to corresponding traces 904 by corresponding electrically conductive bumps 906 such that micromirror device chip 112 is flip chip mounted to substrate 902. Traces 904 are electrically connected to corresponding electrically conductive vias 908 which extend from lower surface 902L to an upper, e.g., second, surface 902U of substrate 902 opposite lower surface 902L. Vias 908 are electrically connected to corresponding electrically conductive traces 910 on upper surface 902U of substrate 902. Formed on traces 910 are corresponding electrically conductive pads 912. Formed on pads 912 are corresponding electrically conductive interconnection balls 914 such as solder balls. Interconnection balls 914 are used to electrically connect assembly 900 to a larger substrate (not shown) such as a printed circuit mother board.

To illustrate, a first bond pad 116A of the plurality of bond pads 116 is electrically connected to a first trace 904A of the plurality of traces 904 by a first bump 906A of the plurality of bumps 906. Trace 904A is electrically connected to a first via 908A of the plurality of vias 908. Via 908A is electrically connected to a first trace 910A of the plurality of traces 910. A first pad 912A of the plurality of pads 912 is formed on trace 910A. Formed on pad 912A is a first interconnection ball 914A of the plurality of interconnection balls 914.

As set forth above, an electrically conductive pathway between bond pad 116A and interconnection ball 914A is formed by bump 906A, trace 904A, via 908A, trace 910A and pad 912A. The other bond pads 116, bumps 906, traces 904, vias 908, traces 910, pads 912 and interconnection balls 914 are electrically connected to one another in a similar fashion so are not discussed further to avoid detracting from the principals of the invention.

Although a particular electrically conductive pathway between interconnection ball 914A and bond pad 116A is described above, in light of this disclosure, it is understood that other electrically conductive pathways can be formed. For example, substrate 902 is a multilayered laminated substrate and, instead of straight-through vias 908, a plurality of electrically conductive traces on various layers in substrate 902 are interconnected by a plurality of electrically conductive vias to form the electrical interconnections between traces 904 and 910.

As a further example, vias 908 extend along side 902S of substrate 902 and traces 904 and 910 extend to side 902S. As another alternative, interconnection balls 914 are distributed in an array format to form a ball grid array (BGA) package. Alternatively, interconnection balls 914 are not formed, e.g., to form a metal land grid array (LGA) package or a leadless chip carrier (LCC) package. Other electrically conductive pathway modifications will be obvious to those of skill in the art.

Substrate 902 includes a central aperture 916. Window 152 is located within, or is located adjacent to, central aperture 916. In particular, exterior surface 152E of window 152 is exposed through aperture 916. During use, radiation is directed at assembly 900. This radiation passes through window 152, strikes micromirror device area 114, which selectively reflects this radiation back through window 152.

Assembly 900 further includes a package body 918. Package body 918 is an electrically insulating material and electrically protects, e.g., prevents shorting of, and environmentally protects, e.g., from moisture, the various electrically conductive structures of assembly 900. In addition, package body 918 provides mechanical strength to assembly 900 and, in particular, minimizes failure of bumps 906 and the associated detachment of micromirror device chip 112 from substrate 902.

Package body 918, in combination with bead 150, mechanically locks window 152 in place. In particular, package body 918 encloses side 152S of window 152, thus mechanically locking window 152 in place. In one embodiment, side 152S of window 152 includes a locking feature such as locking feature 823 illustrated in FIG. 8B thus enhancing the bond between package body 918 and window 152.

Package body 918 is formed of any one of a number of conventional packaging materials. For example, package body 918 is formed from a plastic encapsulant or, alternatively, a liquid encapsulant.

Figure 10:
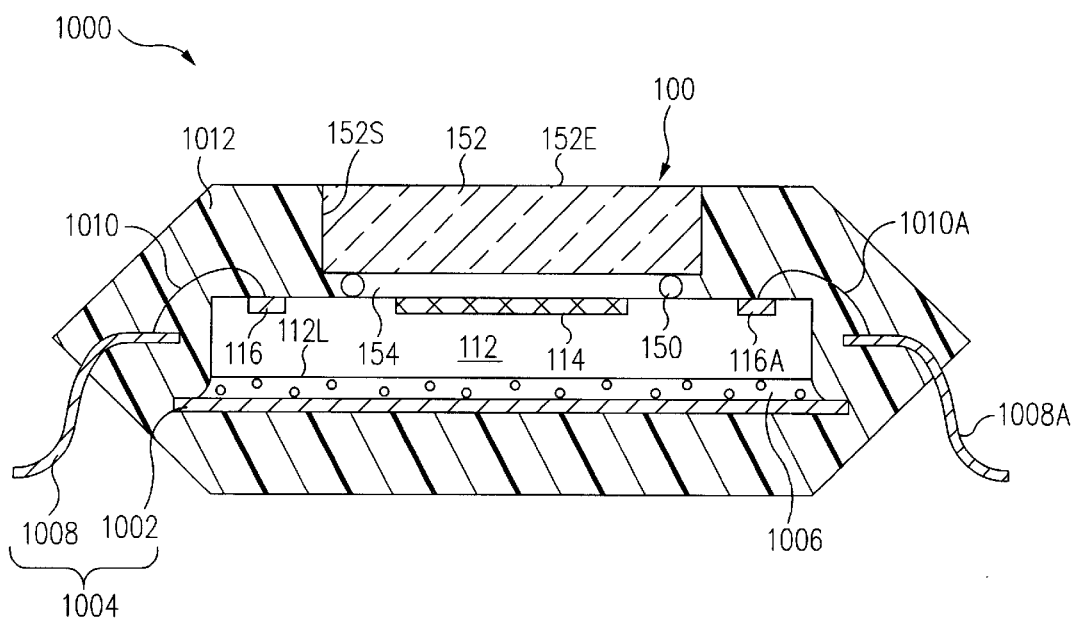
FIG. 10 is a cross-sectional view of a leadframe micromirror device assembly in accordance with an alternative embodiment of the present invention.

FIG. 10 is a cross-sectional view of a leadframe micromirror device assembly 1000 (hereinafter assembly 1000) in accordance with an alternative embodiment of the present invention. Referring now to FIG. 10, a lower, e.g., second, surface 112L of micromirror device chip 112 is attached to a die attach pad 1002 of a leadframe 1004. For example, lower surface 112L is attached to die attach pad 1002 with adhesive 1006.

Leadframe 1004 further includes a plurality of leads 1008. Bond pads 116 are electrically connected to corresponding leads 1008 by corresponding bond wires 1010. For example, a first bond pad 116A of the plurality of bond pads 116 is electrically connected to a first lead 1008A of the plurality of leads 1008 by a first bond wire 1010A of the plurality of bond wires 1010. The other bond pads 116 are electrically connected to the other corresponding leads 1008 by the other corresponding bond wires 1010 in a similar fashion so are not discussed further.

Assembly 1000 further includes a package body 1012. Package body 1012 is an electrically insulating material and electrically protects, e.g., prevents shorting of, and environmentally protects, e.g., from moisture, the various electrically conductive structures of assembly 1000.

Package body 1012, in combination with bead 150, mechanically locks window 152 in place. In particular, package body 1012 encloses side 152S of window 152, thus mechanically locking window 152 in place. In one embodiment, side 152S of window 152 includes a locking feature such as locking feature 823 illustrated in FIG. 8B thus enhancing the bond between package body 1012 and window 152.

Package body 1012 is formed of any one of a number of conventional packaging materials. For example, package body 1012 is formed from a plastic encapsulant or, alternatively, a liquid encapsulant.

Figure 11:
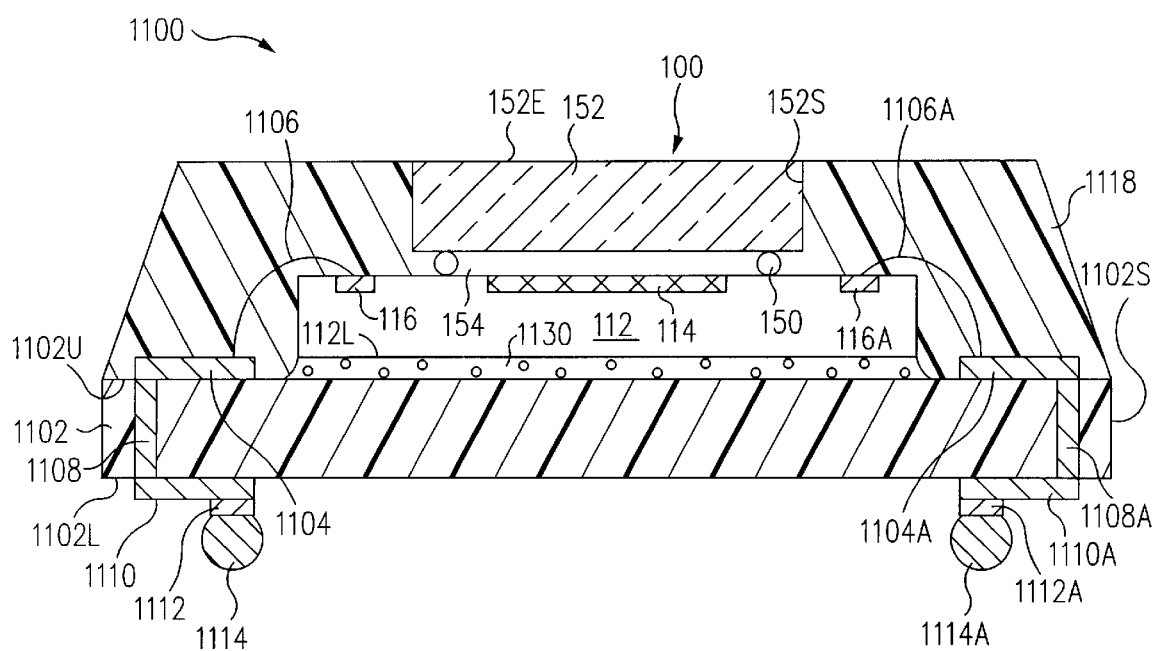
FIG. 11 is a cross-sectional view of a wirebonded micromirror device assembly in accordance with yet another alternative embodiment of the present invention.

FIG. 11 is a cross-sectional view of a wirebonded micromirror device assembly 1100 (hereinafter assembly 1100) in accordance with yet another alternative embodiment of the present invention. Referring to FIG. 11, assembly 1100 includes a substrate 1102. To illustrate, substrate 1102 is a printed circuit board, ceramic, or tape, although other materials are used in other embodiments. Lower surface 112L of micromirror device chip 112 is attached to an upper, e.g., first, surface 1102U of substrate 1102, for example, with adhesive 1130.

Substrate 1102 includes a plurality of electrically conductive traces 1104 formed on upper surface 1102U of substrate 1102. Bond pads 116 are electrically connected to corresponding traces 1104 by corresponding electrically conductive bond wires 1106. Traces 1104 are electrically connected to corresponding electrically conductive vias 1108 which extend from upper surface 1102U to a lower, e.g., second, surface 1102L of substrate 1102 opposite upper surface 1102U. Vias 1108 are electrically connected to corresponding electrically conductive traces 1110 on lower surface 1102L of substrate 1102. Formed on traces 1110 are corresponding electrically conductive pads 1112. Formed on pads 1112 are corresponding electrically conductive interconnection balls 1114 such as solder balls. Interconnection balls 1114 are used to electrically connect assembly 1100 to a larger substrate (not shown) such as a printed circuit mother board.

To illustrate, a first bond pad 116A of the plurality of bond pads 116 is electrically connected to a first trace 1104A of the plurality of traces 1104 by a first bond wire 1106A of the plurality of bond wires 1106. Trace 1104A is electrically connected to a first via 1108A of the plurality of vias 1108. Via 1108A is electrically connected to a first trace 1110A of the plurality of traces 1110. A first pad 1112A of the plurality of pads 1112 is formed on trace 1110A. Formed on pad 1112A is a first interconnection ball 1114A of the plurality of interconnection balls 1114.

As set forth above, an electrically conductive pathway between bond pad 116A and interconnection ball 1114A is formed by bond wire 1106A, trace 1104A, via 1108A, trace 1110A and pad 1112A. The other bond pads 116, bond wires 1106, traces 1104, vias 1108, traces 1110, pads 1112 and interconnection balls 1114 are electrically connected to one another in a similar fashion so are not discussed further to avoid detracting from the principals of the invention.

Although a particular electrically conductive pathway between interconnection ball 1114A and bond pad 116A is described above, in light of this disclosure, it is understood that other electrically conductive pathways can be formed. For example, substrate 1102 is a multi-layered laminated substrate and, instead of straight-through vias 1108, a plurality of electrically conductive traces on various layers in substrate 1102 are interconnected by a plurality of electrically conductive vias to form the electrical interconnections between traces 1104 and 1110.

As a further example, vias 1108 extend along side 1102S of substrate 1102 and traces 1104 and 1110 extend to side 1102S. As another alternative, interconnection balls 1114 are distributed in an array format to form a ball grid array (BGA) package. Alternatively, interconnection balls 1114 are not formed, e.g., to form a metal land grid array (LGA) package or a leadless chip carrier (LCC) package. Other electrically conductive pathway modifications will be obvious to those of skill in the art.

Assembly 1100 further includes a package body 1118.

Package body 1118 is an electrically insulating material and electrically protects, e.g., prevents shorting of, and environmentally protects, e.g., from moisture, the various electrically conductive structures of assembly 1100.

Package body 1118, in combination with bead 150, mechanically locks window 152 in place. In particular, package body 1118 encloses side 152S of window 152, thus mechanically locking window 152 in place. In one embodiment, side 152S of window 152 includes a locking feature such as locking feature 823 illustrated in FIG. 8B thus enhancing the bond between package body 1118 and window 152.

Package body 1118 is formed of any one of a number of conventional packaging materials. For example, package body 1118 is formed from a plastic encapsulant or, alternatively, a liquid encapsulant.

FIGS. 9, 10 and 11 are examples of micromirror device assemblies, which incorporate micromirror device package 100 in accordance with present invention. In light of this disclosure, those of skill in the art will understand that other micromirror device assemblies, which incorporate micromirror device package 100, can be fabricated. For example, solder masks can be applied to upper surface 902U and/or lower surface 902L of substrate 902 (FIG. 9) and/or upper surface 1102U and/or lower surface 1102L of substrate 1102 (FIG. 11).

This application is related to Glenn et al., co-filed and commonly assigned U.S. patent application Ser. No. 09/804, 805 entitled "MICROMIRROR DEVICE PACKAGE FABRICATION METHOD", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A micromirror device package comprising:
    a micromirror device chip comprising a first surface comprising a micromirror device area;
    a window comprising a first surface; and
    a bead coupled to said first surface of said micromirror device chip and to said first surface of said window.

2. The micromirror device package of claim 1 wherein said micromirror device area comprises miniature moveable micromirrors.

3. The micromirror device package of claim 1 wherein said micromirror device chip comprises bond pads coupled to said first surface of said micromirror device chip.

4. The micromirror device package of claim 3 wherein said bead contacts said first surface of said micromirror device chip between said micromirror device area and said bond pads.

5. The micromirror device package of claim 1 wherein said micromirror device area selectively reflects radiation, said window being transparent to said radiation.

6. The micromirror device package of claim 5 wherein said window comprises borosilicate glass.

7. The micromirror device package of claim 5 wherein said radiation is visible light.

8. The micromirror device package of claim 1 wherein said bead defines an area of said first surface of said micromirror device chip, said area comprising said micromirror device area.

9. The micromirror device package of claim 1 wherein said bead comprises solder glass.

10. The micromirror device package of claim 1 wherein said bead consists of solder glass.

11. The micromirror device package of claim 1 wherein said bead comprises epoxy.

12. A micromirror device assembly comprising a micromirror device package comprising:
    a micromirror device chip comprising a micromirror device area;
    a window above said micromirror device area; and
    a bead coupling said window to said micromirror device chip, said bead and said window forming an enclosure above said micromirror device area.

13. The micromirror device assembly of claim 12 wherein said bead and said window hermetically seal said micromirror device area.

14. The micromirror device assembly of claim 13 wherein said bead comprises solder glass.

15. The micromirror device assembly of claim 14 wherein said window comprises borosilicate glass.

16. The micromirror device assembly of claim 12 wherein said window is parallel to a first surface of said micromirror device chip.

17. The micromirror device assembly of claim 16 wherein said window is spaced apart from said first surface of said micromirror device chip by said bead.

18. The micromirror device assembly of claim 12 further comprising a substrate, said micromirror device chip being flip chip mounted to said substrate.

19. The micromirror device assembly of claim 12 further comprising a leadframe comprising a die attach pad, said micromirror device chip being coupled to said die attach pad.

20. The micromirror device assembly of claim 12 further comprising a substrate, said micromirror device chip being coupled to said substrate.

21. A structure comprising:
    a micromirror device substrate comprising a first micromirror device chip comprising a first surface comprising a micromirror device area;
    a window comprising a first surface; and
    a bead coupled to said first surface of said first micromirror device chip and to said first surface of said window.

22. The structure of claim 21 further comprising a window sheet comprising said window.

23. A micromirror device assembly comprising:
    a micromirror device chip comprising a first surface comprising a means for selectively reflecting radiation; and
    a means for hermetically sealing said means for selectively reflecting radiation, said means for hermetically sealing being coupled to said first surface of said micromirror device chip.

24. The micromirror device assembly of claim 23 wherein said means for hermetically sealing comprises a means for allowing said radiation to strike said means for selectively reflecting radiation.

25. The micromirror device assembly of claim 24 wherein said means for hermetically sealing comprises means for attaching said means for allowing to said first surface of said micromirror device chip.

26. A micromirror device package comprising:
    a micromirror device chip comprising a micromirror device area and bond pads on a first surface of said micromirror device chip;
    a bead comprising solder glass attached to said first surface, said bead surrounding said micromirror device area and leaving exposed said bond pads; and
    a window comprising borosilicate glass attached to said first surface by said bead, said window being located above said micromirror device area, wherein said window and said bead hermetically seal said micromirror device area.

27. The micromirror device package of claim 1 wherein said micromirror device area comprises miniature moveable mirrors.

28. The micromirror device package of claim 1 wherein said window comprises a side and a locking feature along said side.

29. The micromirror device package of claim 1 further comprising a substrate comprising a central aperture, said micromirror device chip being flip chip mounted to said substrate such that a second surface of said window is exposed through said central aperture.

* * * * *